United States Patent
Kim et al.

(10) Patent No.: US 9,165,520 B2
(45) Date of Patent: Oct. 20, 2015

(54) GATE DRIVING CIRCUIT AND LIQUID CRYSTAL DISPLAY DEVICE

(75) Inventors: Young-Do Kim, Daegu (KR); Je-Heon Cha, Gyeongsangbuk-Do (KR); Hyun-Jeong Lee, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 822 days.

(21) Appl. No.: 13/174,981

(22) Filed: Jul. 1, 2011

(65) Prior Publication Data

US 2012/0001894 A1 Jan. 5, 2012

(30) Foreign Application Priority Data

Jul. 1, 2010 (KR) .................. 10-2010-0063620

(51) Int. Cl.
*G06G 5/00* (2006.01)
*G09G 3/36* (2006.01)
*G11C 19/28* (2006.01)

(52) U.S. Cl.
CPC .............. *G09G 3/3677* (2013.01); *G11C 19/28* (2013.01); *G09G 2300/0408* (2013.01); *G09G 2310/0286* (2013.01); *G09G 2310/08* (2013.01)

(58) Field of Classification Search
CPC .. G09G 3/3648; G09G 3/3688; G09G 3/3611
USPC ..................... 345/99, 100, 108, 213
See application file for complete search history.

(56) References Cited

U.S. PATENT DOCUMENTS

| | | | |
|---|---|---|---|
| 2006/0227093 A1* | 10/2006 | Jang et al. | 345/100 |
| 2006/0267911 A1 | 11/2006 | Jang | |
| 2006/0274015 A1* | 12/2006 | Endo et al. | 345/98 |
| 2008/0136756 A1* | 6/2008 | Yeo et al. | 345/87 |
| 2008/0150932 A1* | 6/2008 | Takahashi | 345/214 |
| 2008/0204390 A1* | 8/2008 | Moon | 345/87 |
| 2009/0080593 A1 | 3/2009 | Kim et al. | |
| 2009/0256794 A1 | 10/2009 | Jang et al. | |
| 2009/0267883 A1* | 10/2009 | Kim et al. | 345/94 |
| 2009/0296038 A1 | 12/2009 | Yoon et al. | |
| 2010/0201659 A1* | 8/2010 | Miyake et al. | 345/205 |

(Continued)

FOREIGN PATENT DOCUMENTS

| | | |
|---|---|---|
| CN | 1870117 A | 11/2006 |
| CN | 101598875 A | 12/2009 |
| KR | 10-2006-0022510 A | 3/2006 |
| KR | 10-2007-0028978 | 3/2007 |
| KR | 10-2009-0109257 | 10/2009 |

OTHER PUBLICATIONS

Korean Office Action issued in corresponding Korean Patent Application No. 10-2010-0063620 dated May 31, 2013.

(Continued)

*Primary Examiner* — Jonathan Blancha
(74) *Attorney, Agent, or Firm* — Morgan, Lewis & Bockius LLP

(57) ABSTRACT

A gate driving circuit is capable of improving yield by virtue of acquisition of a design margin and reduction of a fabricating cost. The gate driving circuit includes a shift register having N stages driven by a start signal and first to fourth clock signals output from the exterior, and an externally input reset signal is applied to reset terminals of the N−1$^{th}$ stage and the N$^{th}$ stage of the shift register, respectively.

12 Claims, 6 Drawing Sheets

(56) References Cited

U.S. PATENT DOCUMENTS

2010/0201666 A1* 8/2010 Tobita ................... 345/208
2012/0105396 A1* 5/2012 Sakamoto et al. ........... 345/204

OTHER PUBLICATIONS

Office Action issued in technologically related Chinese Patent Application No. 201110230825.9 dated Jan. 14, 2013.

* cited by examiner

GATE DRIVING CIRCUIT AND LIQUID CRYSTAL DISPLAY DEVICE

CROSS-REFERENCE TO RELATED APPLICATION

This application claims the benefit of Korean Patent Application No. 10-2010-0063620, filed on Jul. 1, 2010, which is hereby incorporated by reference for all purposes as if fully set forth herein.

BACKGROUND OF THE INVENTION

1. Field of the Invention

This specification relates to a gate driving circuit, and particularly, to a gate driving circuit capable of improving yield by ensuring a design margin and reducing a fabricating cost, and a liquid crystal display device having the same.

2. Background of the Invention

In general, a liquid crystal display (LCD) device displays an image by adjusting light transmittance of liquid crystal (LC) having dielectric anisotrophy using an electric field.

The LCD device includes a liquid crystal (LC) panel for displaying image data input from the exterior, and a driving circuit for driving the LC panel.

Recently, an LCD device, which employs a Gate In Panel (GIP) type, in which the driving circuit is mounted in the LC panel to reduce a fabricating cost and minimize power consumption.

FIG. 1 shows a GIP type LCD device according to the related art.

As shown in FIG. 1, a plurality of gate lines GL and data lines DL are arranged on an LC panel 10 with perpendicularly intersecting with each other, and a pixel is disposed at each intersection between the gate line GL and the data line DL. Each pixel includes a thin film transistor (TFT) and a pixel electrode connected to the TFT. Here, the TFT operates in response to a signal input from the gate line GL and allows an electrical connection between the data line DL and the pixel electrode.

A gate driving circuit 20 receives a control signal CONT1 from a timing controller 40 to generate a gate signal, and sequentially supplies the generated gate signal to the gate line GL to turn on the corresponding TFT connected to the gate line GL.

A data driving circuit 30 receives a control signal CONT2 and an image signal DAT from the timing controller 40 to apply a data voltage corresponding to the image signal DAT to the data line DL. Such data voltage supplied for each pixel forms an electric field between the pixel electrode and a common electrode to adjust transmittance of an LC layer, accordingly, an image is displayed.

The timing controller 40 controls the gate driving circuit 20 and the data driving circuit 30, and applies the control signal CONT1 to the gate driving circuit 20 and the control signal CONT2 and the image signal DAT to the data driving circuit 30.

Here, the gate driving circuit 20 may be formed on the LC panel 10 at the same time of a TFT process, and the data driving circuit 30 may be formed on the LC panel 10 or may not be formed thereon.

FIG. 2 shows the gate driving circuit of FIG. 1, and FIG. 3 is a timing diagram showing a start signal and a clock signal used in the gate driving circuit.

As shown in FIG. 2, the gate driving circuit 20 includes a shift register 21 having N stages, which are driven by a start signal Vst and four clock signals CLK1 to CLK4 applied (output) from the timing controller 40, and a dummy shift register 23 having first and second dummy stages.

Among the N stages, the first stage receives the start signal Vst and the first clock signal CLK1 to output a gate signal Vout1 on the first gate line. Accordingly, the $N^{th}$ stage receives a gate signal Vout(N-2) of $N-2^{th}$ shift register as a start signal and the fourth clock signal CLK4 to output an $N^{th}$ gate signal VoutN.

Here, each of the N stages first outputs a gate signal, namely, a high level gate signal, and then outputs a low level gate signal by a reset signal RESET. For example, the first stage first outputs the high level gate signal Vout1, and then outputs a low level gate signal by receiving a gate signal Vout3 of the third stage as the reset signal RESET.

In the meantime, each of the $N-1^{th}$ stage and the $N^{th}$ stage should first output a high level gate signal and then output a low level gate signal by receiving a reset signal. However, the timing controller 40 of FIG. 1 does not separately provide a reset signal for resetting the $N-1^{th}$ stage and the $N^{th}$ stage. Hence, the dummy shift register 23 is further formed on the LC panel 10 so as to provide a reset signal to each of the $N-1^{th}$ stage and the $N^{th}$ stage.

FIG. 4 shows a bidirectional gate driving circuit for the GIP type LCD device.

As shown in FIG. 4, the bidirectional gate driving circuit 50 includes a shift register 51 having N stages, which are driven by a start signal Vst and four clock signals CLK1 to CLK4 output from the timing controller 40, and first and second dummy gate driving units 53 and 55 having first and second dummy stages, respectively.

The shift register 51 having the N stages are the same as the shift register 21 of FIG. 2 in configuration and operation. The first and second dummy gate driving units 53 and 55 include first and second dummy stages, respectively, although not shown.

Upon operating as a forward gate driving circuit, the first dummy gate driving unit 53 is driven by a start signal Vst and first and second clock signals CLK1 and CLK2 received from the timing controller 40, and the shift register 51 having the N stages is driven by the start signal Vst, the first and second clock signals CLK1 and CLK2 and a reset signal RESET output from the first dummy gate driving unit 53.

As such, for the forward operation of the gate driving circuit 50, each of the $N-1^{th}$ stage and the $N^{th}$ stage of the shift register 51 should first output a high level gate signal and then output a low level gate signal by receiving the reset signal RESET, as shown in FIG. 2. However, the timing controller 40 of FIG. 1 does not separately provide reset signals for resetting the $N-1^{th}$ stage and the $N^{th}$ stage, the first dummy gate driving unit 53 is further formed on the LC panel 10 to provide the reset signals to the $N-1^{th}$ stage and the $N^{th}$ stage.

Also, upon operating as a backward gate driving circuit, the second dummy gate driving unit 55 is driven by the start signal Vst and the first and second clock signals CLK1 and CLK2 output from the timing controller 40, and the shift register 51 having the N stages is driven by the start signal Vst, the first and second clock signals CLK1 and CLK2 and the reset signal RESET output from the second dummy gate driving unit 55. Here, since the gate driving circuit operates in 25 the backward manner, the first stage operates as the $N^{th}$ stage, the second stage as the $N-1^{th}$ stage, and the $N^{th}$ stage as the first stage.

Each of the $N-1^{th}$ stage and the $N^{th}$ stage of the shift register 51 should first output a high level gate signal and then output a low level gate signal by receiving a reset signal RESET. However, the timing controller 40 of FIG. 1 does not separately provide a reset signal for resetting the $N-1^{th}$ stage and the $N^{th}$ stage. Hence, the second dummy gate driving unit 55 is further formed on the LC panel 10 so as to provide a reset signal to each of the $N-1^{th}$ stage and the $N^{th}$ stage.

As such, upon employing the GIP type gate driving circuit of FIG. 2 and the GIP type bidirectional gate driving circuit of FIG. 4, the dummy shift register 23 and the first and second dummy gate driving units 53 and 55 should be respectively formed on the LC panel 10, which causes reduction of a design area and difficulty in ensuring a process margin, resulting in an increase in a fabricating cost of the LC panel 10.

Referring to part 'A' of FIG. 3, the first and second clock signals CLK1 and CLK2 additionally have signal waveforms for operating the dummy shift register 23 and the first and second dummy gate driving units 53 and 55, thereby causing an increase in a memory capacity within the timing controller 40.

Furthermore, in the structure of the GIP type bidirectional gate driving circuit shown in FIG. 4, since the start signal Vst output from the timing controller 40 is input to the shift register 51 not directly but via the first and second dummy gate driving units 53 and 55, an output characteristic of a signal may be lowered. Consequently, when the performance of the first and second dummy gate driving units 53 and 55 is degraded due to a long-term driving of the bidirectional gate driving circuit, the output of the gate signals output from the shift resistor 51 is lowered.

SUMMARY OF THE INVENTION

Therefore, to address such problems, an aspect of the detailed description is to provide a gate driving circuit capable of improving yield by ensuring a design margin and reducing a fabricating cost, and a liquid crystal display device having the same.

To achieve these and other advantages and in accordance with the purpose of this specification, as embodied and broadly described herein, there is provided a gate driving circuit including a shift register having N stages driven by a start signal and first to fourth clock signals input from the exterior, and an externally input reset signal may be applied to reset terminals of the $N-1^{th}$ stage and the $N^{th}$ stage of the shift register, respectively.

The reset signal may be generated using the start signal.

The reset signal may be a start signal which is converted from a low level into a high level at the time point when the fourth clock signal is converted from a high level into a low level.

The reset signal may be 1H or 2H wide.

The width of the reset signal may differ depending on resolution of a liquid crystal panel.

The reset signal may be a separate reset signal, which is converted from a low level into a high level at the time point when the fourth clock signal is converted from a high level into a low level.

The reset signal may be 1H or 2H wide.

The gate driving circuit may be a bidirectional gate driving circuit operating in a forward or backward manner.

The start signal and the reset signal may be input directly to the bidirectional gate driving circuit.

To achieve these and other advantages and in accordance with the purpose of this specification, as embodied and broadly described herein, a liquid crystal display device may include a liquid crystal panel configured to display an externally input image signal, a timing controller configured to generate gate and data control signals for driving a gate driving circuit and a data driving circuit, a data driving circuit configured to apply a data voltage corresponding to an image signal to a corresponding data line by receiving the data control signal from the timing controller, and a gate driving circuit configured to apply a gate signal to a corresponding gate line by receiving the gate control signal from the timing controller, the gate driving circuit comprising a shift register having N stages driven by a start signal and first to fourth clock signal input from the exterior, wherein an externally input reset signal is applied to reset terminals of the $N-1^{th}$ stage and the $N^{th}$ stage of the shift register, respectively.

The reset signal may be generated using the start signal.

The reset signal may be a start signal, which is converted from a low level into a high level at the time point when the fourth clock signal is converted from a high level into a low level.

The reset signal may be 1H or 2H wide.

The width of the reset signal may differ depending on resolution of the liquid crystal panel.

The reset signal may be a separate reset signal, which is converted from a low level into a high level at the time point when the fourth clock signal is converted from a high level into a low level.

The reset signal may be 1H or 2H wide.

The gate driving circuit may be a bidirectional gate driving circuit operating in a forward or backward manner.

The start signal and the reset signal may be input directly to the bidirectional gate driving circuit.

As described above, the gate driving circuit and a liquid crystal display device having the same can provide an effect of improving yield by ensuring a design margin and reducing a fabricating cost.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of a GIP type LCD device in accordance with the exemplary embodiments, with reference to the accompanying drawings. For the sake of brief description with reference to the drawings, the same or equivalent components will be provided with the same reference numbers, and description thereof will not be repeated.

Figure 1:
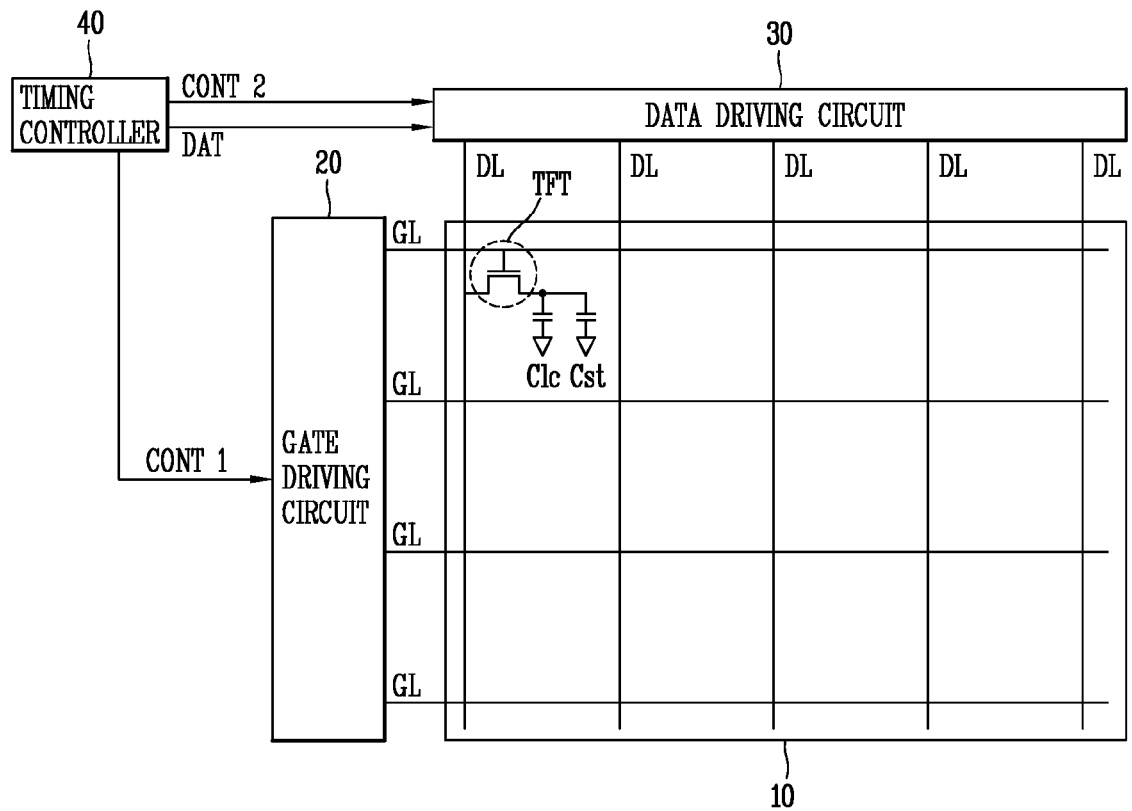
FIG. 1 shows a GIP type LCD device according to the related art.
Figure 2:
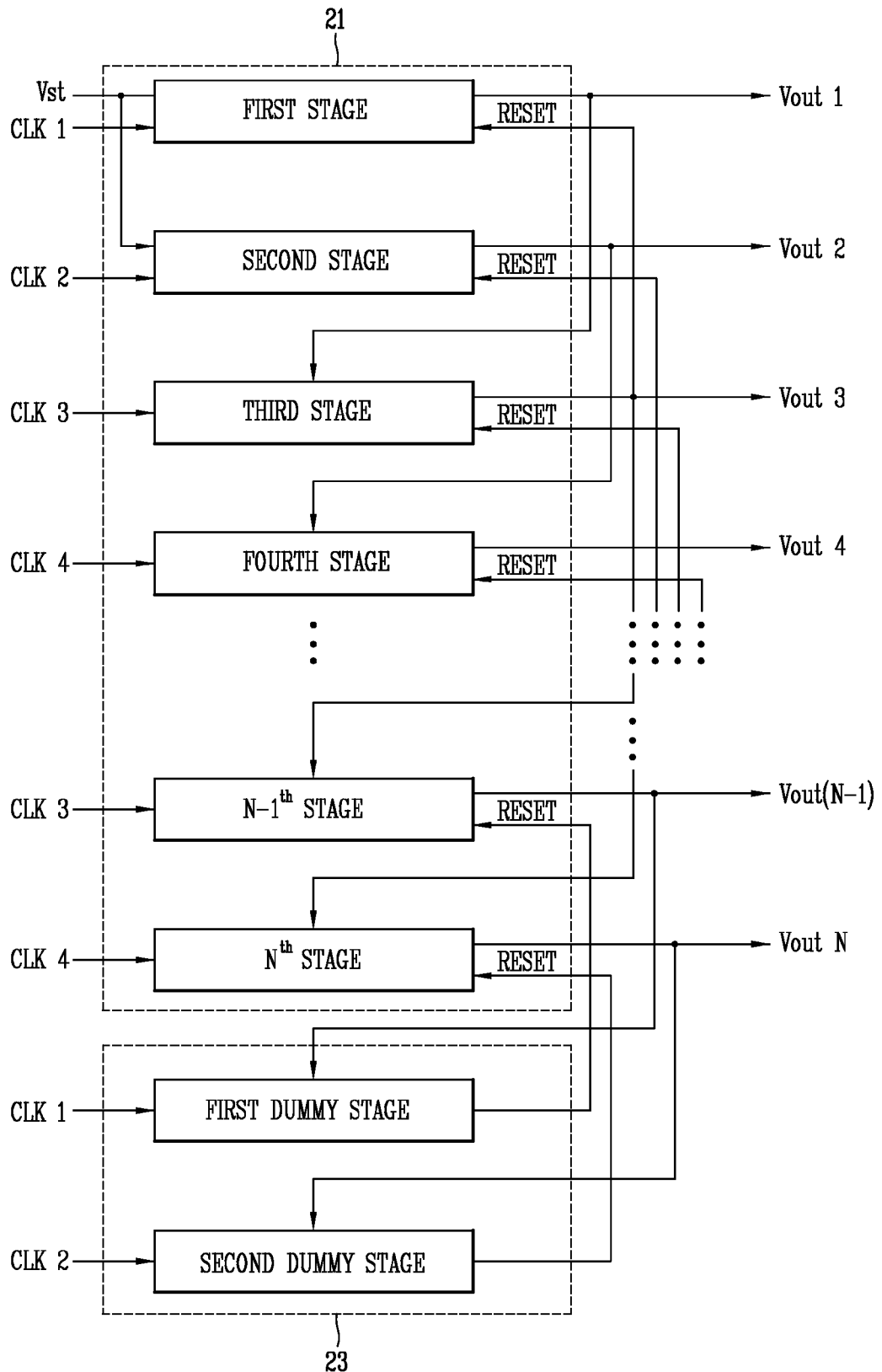
FIG. 2 shows a gate driving circuit of FIG. 1.
Figure 3:
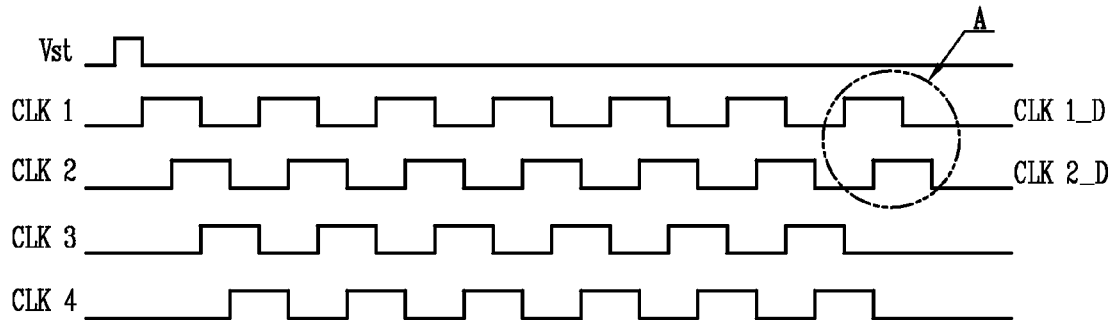
FIG. 3 is a timing diagram showing a start signal and clock signals used in the gate driving circuit.
Figure 4:
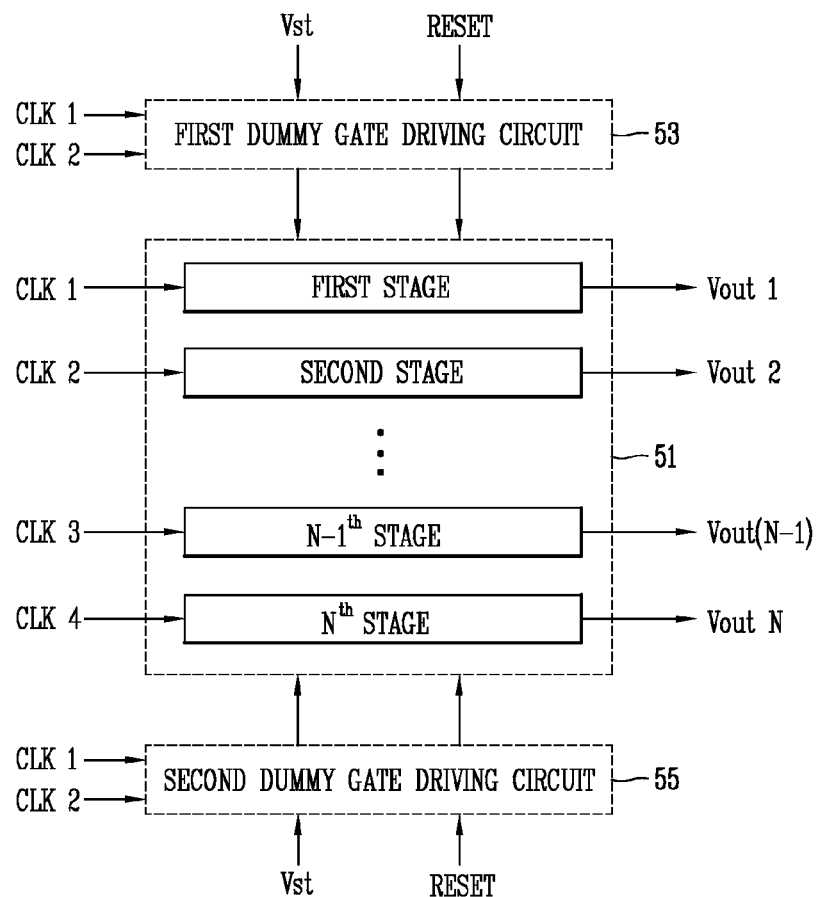
FIG. 4 shows a bidirectional gate driving circuit for the GIP type LCD device.
Figure 5:
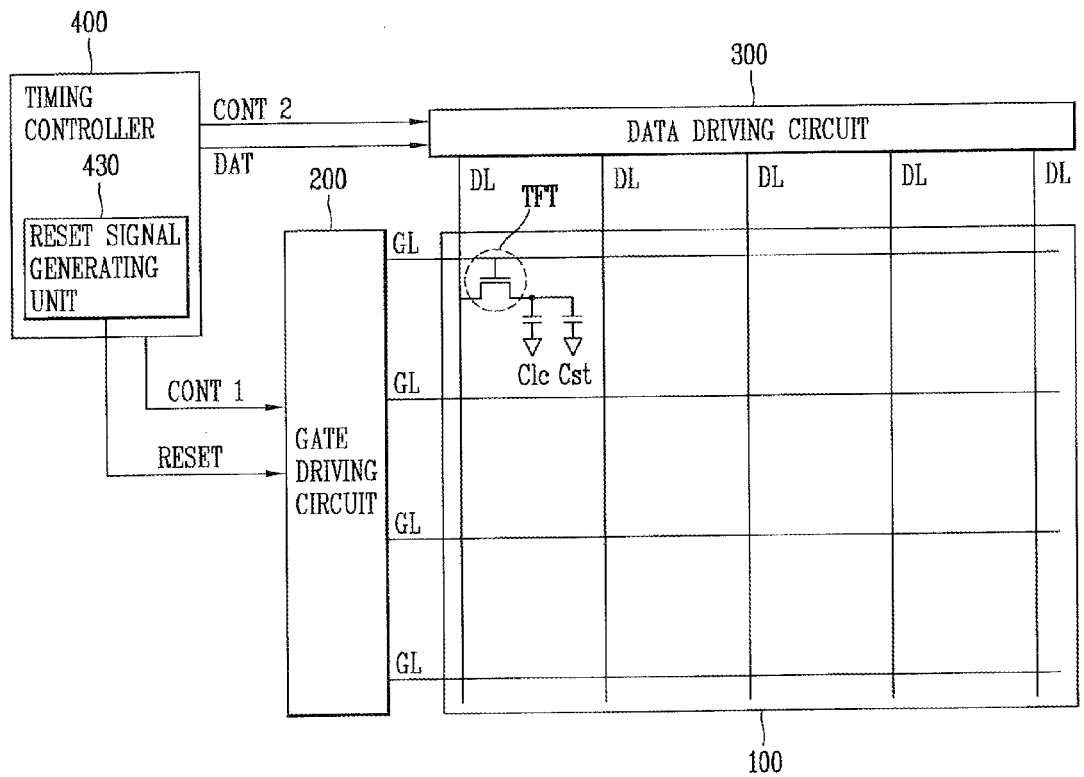
FIG. 5 shows a GIP type LCD device in accordance with one exemplary embodiment.

FIG. 5 shows a GIP type LCD device in accordance with one exemplary embodiment.

As shown in FIG. 5, the GIP type LCD device may include an LC panel 100, a gate driving circuit 200, a data driving circuit 300 and a timing controller 400.

The LC panel 100 may include a plurality of gate lines GL and a plurality of data lines DL, and a plurality of pixels connected to the gate and data lines GL and DL and aligned in a matrix configuration. Here, the gate lines GL may be formed in a horizontal direction, and the data lines DL may be formed in a vertical direction.

Each pixel may include a TFT connected to the gate line GL and the data line DL, and an LC capacitor Clc and a storage capacitor Cst both connected to the TFT.

The TFT may be formed on an array substrate. The TFT may be implemented as a three-terminal device. A control terminal and an input terminal may be connected to the gate line GL and the data line DL, respectively, and an output terminal may be connected to the LC capacitor Clc and the storage capacitor Cst.

The LC capacitor Clc may use a pixel electrode of an array substrate and a common electrode of a color filter substrate as two terminals, and an LC layer interposed between the two electrodes may act as a dielectric. The pixel electrode may be connected to the TFT. The common electrode may be formed on an entire surface of the color filter substrate and receive a common voltage Vcom.

The storage capacitor Cst may be defined as a separate signal line (not shown) and the pixel electrode disposed on the array substrate overlap with each other.

Meanwhile, each pixel must render a color to allow representation of colors. This may be enabled by disposing a red, green or blue color filter on a region corresponding to the pixel electrode. Here, the color filters may be disposed on corresponding regions of the color filter substrate.

A polarizer (not shown) for polarizing light may be attached onto an outer surface of at least one of the array substrate and the color filter substrate of the LC panel 100.

The gate driving circuit 200 may employ a GIP mechanism, and apply a gate signal to a gate line GL, in response to a gate control signal CONT1 provided from the timing controller 400, to turn on the TFT connected to the gate line GL. Also, the gate driving circuit 200 may include a shift register for improving yield by way of ensuring a design margin and reducing a fabricating cost, which will be described later in detail with reference to FIG. 8.

The data driving circuit 300 may sequentially receive image signals DAT corresponding to respective unit pixels in one column in response to a data control signal CONT2 provided from the timing controller 400, and select a data voltage corresponding to each image signal DAT from data voltages, thereby converting the image signal DAT into the corresponding data voltage.

The timing controller 400 may generate gate and data control signals CONT1 and CONT2 for control of operations of the gate driving circuit 200 and the data driving circuit 300, and apply the corresponding control signals to the gate driving circuit 200 and the data driving circuit 300, respectively. Also, the timing controller 400 may include a reset signal generating unit 430 for providing a reset signal RESET to the gate driving circuit 200, which will be described in detail with reference to FIG. 6.

Figure 6:
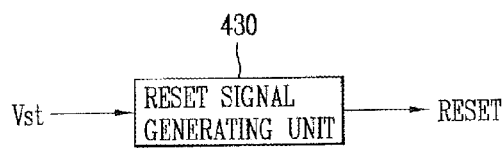
FIG. 6 shows a reset signal generating unit in accordance with the one exemplary embodiment.
Figure 7:
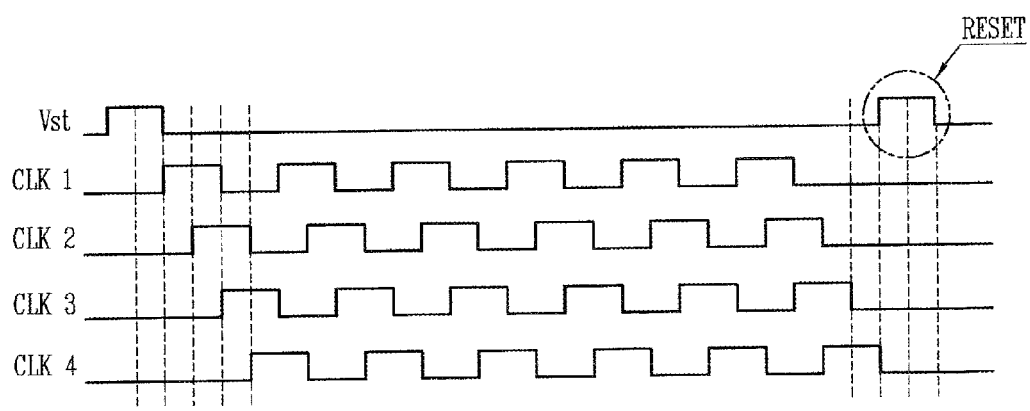
FIG. 7 is a timing diagram showing a start signal and clock signals used in the gate driving circuit in accordance with the one exemplary embodiment.
Figure 8:
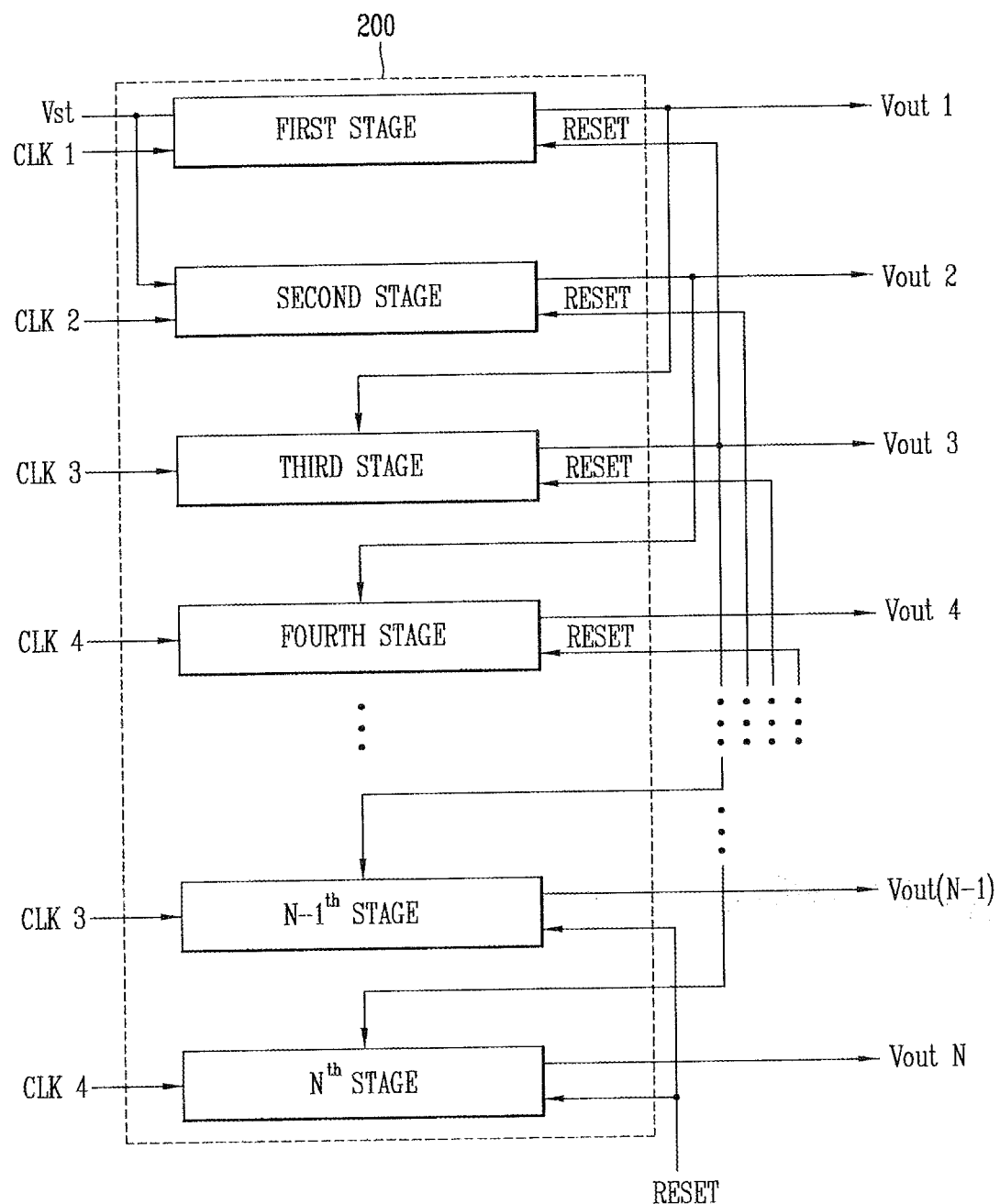
FIG. 8 shows the gate driving circuit in accordance with the one exemplary embodiment.

FIG. 6 shows a reset signal generating unit in accordance with the one exemplary embodiment, FIG. 7 is a timing diagram showing a start signal and clock signals used in the gate driving circuit in accordance with the one exemplary embodiment, and FIG. 8 shows the gate driving circuit in accordance with the one exemplary embodiment.

As shown in FIG. 6, the timing controller 400 may include the reset signal generating unit 430. The reset signal generating unit 430, as shown in FIG. 7, may receive a start signal Vst output from the timing controller 400 and uses it as a reset signal RESET. Here, the reset signal generating unit 430 may output the reset signal RESET, which the start signal Vst is converted from a low level into a high level, at the time point when the fourth clock signal CLK4 is converted from a high level into a low level. The reset signal RESET output from the reset signal generating unit 430 may be applied to the gate driving circuit 200.

Here, the start signal Vst and the first to fourth clock signals CLK1 to CLK4 may be output from the timing controller 400. For example, the start signal Vst may be, but not limited to, 1H or 2H wide. Also, the width of the reset signal RESET may differ depending on resolution of the LC panel 100.

In this specification, in order to generate the reset signal RESET, the start signal Vst output from the timing controller 400 may not be used, but an optional signal may be used to separately generate a reset signal RESET, which is converted from a low level into a high level at the time point when the fourth clock signal CLK4 is converted from a high level into a low level. The thusly-generated reset signal RESET may be applied to the gate driving circuit 200. Here, the reset signal RESET may be 1H or 2H wide, for example.

This specification exemplarily illustrates that the reset signal generating unit 430 is included in the timing controller 400. Alternatively, the reset signal generating unit 430 may not be included in the timing controller 400.

As shown in FIG. 8, the gate driving circuit 200 may include a shift register 25 having N stages driven by the start signal Vst and the four clock signals CLK1 to CLK4 output from the timing controller 400.

Here, among the N stages, the first stage may receive the start signal Vst and the first clock signal CLK1 to output a gate signal Vout1 to the gate line GL, and receive a gate signal Vout3, which is output from the third stage, to use as a reset signal RESET.

The second stage may receive the start signal Vst and the second clock signal CLK2 to output a gate signal Vout2 to the second gate line GL, and receive a gate signal Vout4 output from the fourth stage to use as a reset signal RESET.

The third stage may receive a gate signal Vout1, output from the first stage, as the start signal Vst, and the third clock signal CLK3 to output the gate signal Vout3 to the third gate line GL, and although not shown, receive a gate signal Vout5 output from the fifth stage to use as a reset signal RESET.

The fourth stage may receive the gate signal Vout2, output from the second stage, as the start signal Vst, and the fourth clock signal CLK4 to output the gate signal Vout4 to the fourth gate line GL, and although not shown, receive a gate signal Vout6 output from the sixth stage to use as a reset signal RESET.

The N-1$^{th}$ stage, although not shown, may receive a gate signal Vout(N-3) output from the N-3$^{th}$ stage, as the start signal Vst, and the third clock signal CLK3 to output a gate signal Vout(N-1) to the N-1$^{th}$ gate line GL, and as shown in FIG. 7, receive the reset signal RESET output from the reset signal generating unit 430 as a reset signal for the N-1$^{th}$ stage.

The N$^{th}$ stage, although not shown, may receive a gate signal Vout(N-2) output from the N-2$^{th}$ stage, as the start signal Vst, and the fourth clock signal to output a gate signal VoutN to the N$^{th}$ gate line GL, and as shown in FIG. 7, use the reset signal RESET output from the reset signal generating unit 430 as the reset signal RESET of the N$^{th}$ stage.

As such, unlike the related art gate driving circuit which provides the reset signals to the N-1$^{th}$ stage and the N$^{th}$ stage by further forming the dummy shift register on the LC panel, the gate driving circuit in accordance with the one exemplary embodiment can generate the reset signal from the exterior to output to the N-1$^{th}$ stage and the N$^{th}$ stage. Such configuration may not require the dummy shift register on the LC panel so as to allow an increase in a design area, resulting in ensuring of a process margin. Consequently, a fabricating cost of the LC panel can be reduced.

Figure 9:
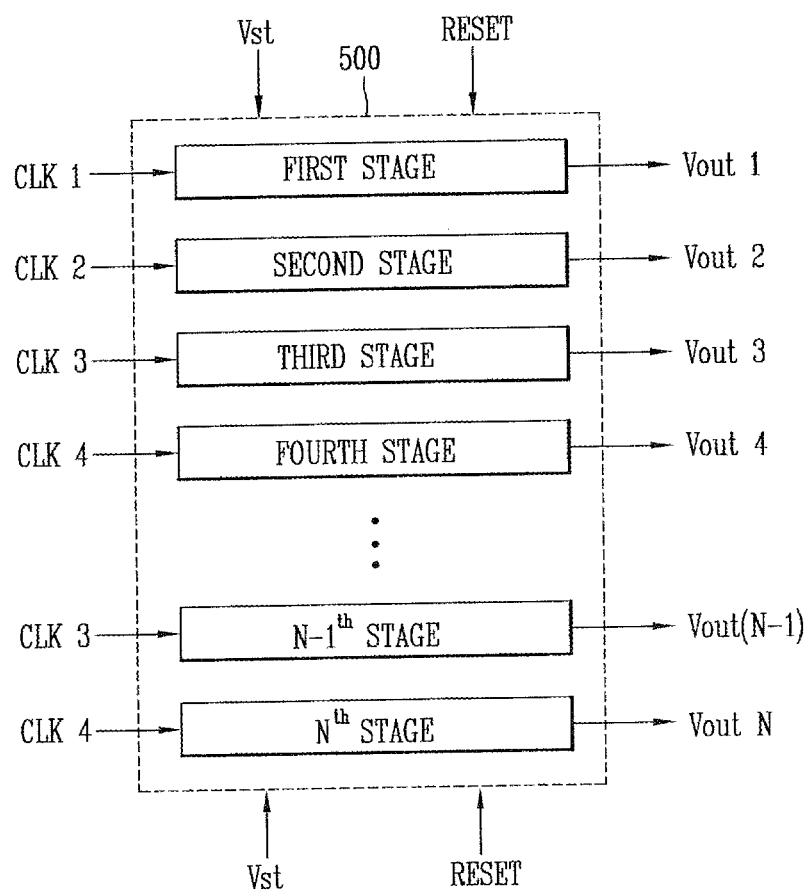
FIG. 9 shows a bidirectional gate driving circuit for a GIP type LCD device in accordance with another exemplary embodiment.

FIG. 9 shows a bidirectional gate driving circuit for a GIP type LCD device in accordance with another exemplary embodiment.

As shown in FIG. 9, a bidirectional gate driving circuit 500 in accordance with another exemplary embodiment may receive a start signal Vst and a reset signal RESET directly from the timing controller 400 of FIG. 7, which minimizes the lowering of output characteristics of the start signal Vst and the reset signal RESET.

Here, when the gate driving circuit 500 operates in a forward manner, it may operate the same as the gate driving circuit 200 of FIG. 8. Here, the gate driving circuit 500 may use the reset signal RESET output from the reset signal generating unit 430 as the reset signal RESET for the N-1$^{th}$ stage and the N$^{th}$ stage.

Also, when the gate driving circuit 500 operates in a backward (reverse) manner, the first stage may operate as the N$^{th}$ stage, the second stage as the N-1$^{th}$ stage and the N$^{th}$ stage as the first stage. Here, similar to the gate driving circuit operating in the forward manner, the reset signal output from the reset signal generating unit 430 may be used as the reset signal RESET of the N-1$^{th}$ stage and the N$^{th}$ stage.

Hence, unlike the related art gate driving circuit which provides the reset signal to the N-1$^{th}$ stage and the N$^{th}$ stage by further forming the dummy shift register above or below the LC panel, the bidirectional gate driving circuit according to the another exemplary embodiment can generate the reset signal from the exterior to output to each of the N-1$^{th}$ stage and the N$^{th}$ stage. Such configuration may not require the dummy shift register on the LC panel so as to allow an increase in a design area, resulting in ensuring of a process margin. Consequently, a fabricating cost of the LC panel can be reduced.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A gate driving circuit comprising a shift register having N stages which operate by a start signal and first to fourth clock signals output from the exterior,
   wherein an output signal of the 3$^{rd}$ stage to the N$^{th}$ stage is applied as a 1$^{st}$ reset signal to reset terminals of the 1$^{st}$ stage to the N-2$^{th}$ stage of the shift register, respectively,
   wherein a same 2$^{nd}$ reset signal provided from a timing controller is applied to reset terminals of the N-1$^{th}$ stage and the N$^{th}$ stage of the shift register,
   wherein the 2$^{nd}$ reset signal from the timing controller is generated using the start signal,
   wherein the 2$^{nd}$ reset signal from the timing controller is a signal generated in a manner that a signal generating unit disposed in the timing controller converts the start signal, and
   wherein the 1$^{st}$ stage and the 2$^{nd}$ stage receive the start signal applied from the exterior, and the 3$^{rd}$ stage to the N$^{th}$ stage sequentially receive output signals from the 1$^{st}$ stage to the N-2$^{th}$ stage as start signals, respectively.

2. The circuit of claim 1, wherein the 2$^{nd}$ reset signal from the timing controller is converted from a low level into a high level at the time point when the fourth clock signal is converted from a high level into a low level.

3. The circuit of claim 2, wherein each reset signal is 1H or 2H wide.

4. The circuit of claim 1, wherein the width of each reset signal differs depending on resolution of a liquid crystal panel.

5. The circuit of claim 1, wherein the gate driving circuit is a bidirectional gate driving circuit operating in a forward or backward manner.

6. The circuit of claim 5, wherein the start signal and each reset signal are input directly to the bidirectional gate driving circuit.

7. A liquid crystal display device comprising:
   a liquid crystal panel configured to display an externally input image signal;
   a timing controller configured to generate gate and data control signals for driving a gate driving circuit and a data driving circuit;
   a data driving circuit configured to apply a data voltage corresponding to an image signal to a corresponding data line by receiving the data control signal from the timing controller;
   a gate driving circuit configured to apply a gate signal to a corresponding gate line by receiving the gate control signal from the timing controller, the gate driving circuit comprising a shift register having N stages driven by a start signal and first to fourth clock signal input from the exterior;
   wherein an output of the 3$^{rd}$ stage to the N$^{th}$ stage is applied as a 1$^{st}$ reset signal to reset terminals of the 1$^{st}$ stage to the N-2$^{th}$ stage of the shift register, respectively;
   wherein a same 2$^{nd}$ reset signal provided from the timing controller is applied to reset terminals of the N-1$^{th}$ stage and the N$^{th}$ stage of the shift register;
   wherein the 2$^{nd}$ reset signal provided from the timing controller is generated using the start signal; and wherein the $1^{st}$ stage and the $2^{nd}$ stage receive the start signal applied from the exterior, and the $3^{rd}$ stage to the $N^{th}$ stage sequentially receive output signals from the $1^{st}$ stage to the $N-2^{th}$ stage as start signals, respectively.

8. The device of claim 7, wherein the $2^{nd}$ reset signal provided from the timing controller is a start signal, which is converted from a low level into a high level at the time point when the fourth clock signal is converted from a high level into a low level.

9. The device of claim 8, wherein each reset signal is 1H or 2H wide.

10. The device of claim 7, wherein the width of each reset signal differs depending on resolution of the liquid crystal panel.

11. The device of claim 7, wherein the gate driving circuit is a bidirectional gate driving circuit operating in a forward or backward manner.

12. The device of claim 11, wherein the start signal and each reset signal are input directly to the bidirectional gate driving circuit.

* * * * *